(12) United States Patent
Johnson

(10) Patent No.: US 6,967,390 B2
(45) Date of Patent: Nov. 22, 2005

(54) ELECTRONIC COMPONENT AND METHOD OF MANUFACTURING SAME

(75) Inventor: Gary Johnson, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 197 days.

(21) Appl. No.: 10/367,344

(22) Filed: Feb. 13, 2003

(65) Prior Publication Data
US 2004/0159916 A1    Aug. 19, 2004

(51) Int. Cl.⁷ .......................................... H01L 23/552

(52) U.S. Cl. ...................... 257/659; 257/660; 257/699; 257/676

(58) Field of Search ............................... 257/659–660, 257/699, 676

(56) References Cited

U.S. PATENT DOCUMENTS

| | | | | |
|---|---|---|---|---|
| 3,961,123 A | * | 6/1976 | Ohtomo ....................... | 442/187 |
| 4,541,003 A | * | 9/1985 | Otsuka et al. ............... | 257/660 |
| 4,888,449 A | * | 12/1989 | Crane et al. ................ | 174/52.4 |
| 5,844,168 A | * | 12/1998 | Schueller et al. ........... | 174/52.4 |
| 6,344,976 B1 | | 2/2002 | Schoenfeld et al. | |
| 6,750,069 B2 | * | 6/2004 | Durcan et al. ................. | 438/3 |
| 6,777,819 B2 | | 8/2004 | Huang | |
| 2001/0019780 A1 | * | 9/2001 | Obata et al. ................ | 428/607 |

* cited by examiner

*Primary Examiner*—Luan Thai
(74) *Attorney, Agent, or Firm*—Bryan Cave LLP

(57) ABSTRACT

An electronic component includes an electronic chip (110) and a chip carrier portion (120) having sidewalls (121) and a bottom portion (122). The electronic chip is mounted over the bottom portion of the chip carrier portion, and the chip carrier portion shields the electronic chip from radiation outside of the electronic component.

22 Claims, 2 Drawing Sheets

ELECTRONIC COMPONENT AND METHOD OF MANUFACTURING SAME

FIELD OF THE INVENTION

This invention relates generally to electronic components, and relates more particularly to packaging for electronic components.

BACKGROUND OF THE INVENTION

Random access memory (RAM) is used for data storage in almost all electronic devices. Various types of RAM have been developed, including static RAM (SRAM), dynamic RAM (DRAM), synchronous DRAM (SDRAM), double data rate SDRAM (DDR SDRAM), magnetoresistive RAM (MRAM), and others. MRAM combines the high speed of SRAM with the high density of DRAM. This combination allows MRAM to store greater amounts of data, to be accessed faster, and to consume less power than other types of electronic memory.

A metal is magnetoresistive if it shows a change in electrical resistance when placed in a magnetic field. MRAM stores data bits using magnetic charges instead of the electrical charges used by DRAM and SRAM. Thus an MRAM device requires extensive electromagnetic shielding in order to prevent memory loss. Existing MRAM devices are electromagnetically shielded on the top and bottom of such devices by the deposition of shielding layers during the MRAM fabrication process, but existing MRAM devices have no protection around the other four sides of such devices. Thus there exists a need for an electronic component capable of shielding MRAM and other electronic devices from radiation.

BRIEF DESCRIPTION OF THE DRAWINGS

The invention will be better understood from a reading of the following detailed description, taken in conjunction with the accompanying figures in the drawings in which.

Figure 1:
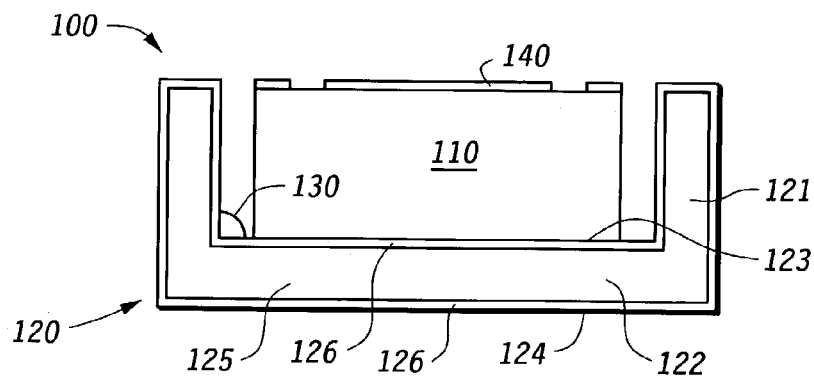
FIG. 1 is a side cross-sectional view of a portion of an electronic component according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the- embodiments of the invention described herein are, for example, capable of operation in other orientations than those illustrated or otherwise described herein. The term "coupled," as used herein, is defined as directly or indirectly connected in a mechanical or non-mechanical manner.

DETAILED DESCRIPTION OF THE DRAWINGS

In one embodiment of the invention, an electronic component includes an electronic chip and a chip carrier portion having sidewalls and a bottom portion. The electronic chip is mounted over the bottom portion of the chip carrier portion, and the chip carrier portion shields the electronic chip from radiation outside of the electronic component.

Referring now to FIG. 1, which is a side cross-sectional view of a portion of an electronic component according to an embodiment of the invention, an electronic component 100 comprises a chip carrier portion 120 and an electronic chip 110 mounted therein. Chip carrier portion 120 has sidewalls 121 and a bottom portion 122, and can be a portion of a leadframe, a ceramic chip carrier, a grid array package, or some other chip carrying structure. Electronic component 100 can be a surface mount device, a leaded device, or the like.

In one embodiment, sidewalls 121 of chip carrier portion 120 can have a height substantially equal to a height of electronic chip 110, such that subsequently-performed wire bonding is easily performed. In other embodiments, however, sidewalls 121 of chip carrier portion 120 can have a height greater or less than the height of electronic chip 110. The combination of sidewalls 121 and bottom portion 122 provides a longer path for moisture ingress than do existing chip carrying structures. Accordingly, sidewalls 121 and bottom portion 122 at least partially prevent moisture from entering chip carrier portion 120.

Sidewalls 121 can comprise a unitary piece, or sidewalls 121 can be comprised of separate pieces. For example, sidewalls 121 may comprise four sidewalls that are each separately attached to bottom portion 122 but that are not attached to each other, thus leaving gaps between the four sidewalls at the corners of bottom portion 122. As another example, sidewalls 121 can comprise four sidewalls that each comprise multiple pieces, with gaps in between each piece.

Sidewalls 121 can be contiguous with bottom portion 122, and sidewalls 121 and bottom portion 122 can form a unitary piece. In the same or another embodiment, sidewalls 121 and bottom portion 122 can each be substantially planar, and sidewalls 121 can be substantially perpendicular to bottom portion 122. In another embodiment, sidewalls 121 and bottom portion 122 can form an angle 130 between them, with a value between approximately eighty and one hundred degrees.

Electronic chip 110 is mounted over bottom portion 122 of chip carrier portion 120. Electronic chip 110 can be a memory device such as RAM, DRAM, etc., or electronic chip 110 can be another type of integrated circuit (IC). Alternatively, electronic chip 110 can be a discrete device such as a power transistor. In a particular embodiment, electronic chip 110 is an MRAM device. As described hereinabove, MRAM devices are sensitive to, and must be protected from, outside radiation, including electric and magnetic fields, in order to avoid data loss. Chip carrier portion 120 shields electronic chip 110 from radiation originating outside of electronic component 100.

Chip carrier portion 120 may be comprised of a metallic material, such as copper, and a radiation-shielding material. The radiation-shielding material may comprise a ferromagnetic material. In a particular embodiment, the radiation-shielding material comprises nickel-iron, and in other particular embodiments, the radiation-shielding material comprises nickel-iron-cobalt or iron-cobalt. The radiation-shielding material can be a homogeneous layer wherein each portion of the radiation-shielding layer contains approximately the same proportions of the components of the layer as does each other portion of the layer. In an embodiment where the radiation-shielding material is nickel-iron, the proportions can be approximately twenty percent nickel and eighty percent iron. A nickel-iron-cobalt embodiment can have proportions of approximately twenty percent nickel, seventy percent iron, and ten percent cobalt. Other proportions are also possible, as will be apparent to one of ordinary skill in the art.

In one embodiment, chip carrier portion 120 comprises a layer 125 and a layer 126, wherein layer 125 comprises copper and layer 126 comprises the radiation-shielding material. As an example, layer 126 can have a thickness of between approximately 3.8 micrometers and approximately 5.1 micrometers. The radiation-shielding material of layer 126 may be deposited using a standard plating process as known in the art. For example, in an embodiment where the radiation-shielding material is nickel-iron, the radiation-shielding material may be deposited using a nickel-iron bath. In a different embodiment, chip carrier portion 120 may consist of a single layer comprising a radiation-shielding material.

The particular radiation-shielding material used may be selected based on several criteria. Among the criteria that may be used to select the radiation-shielding material are: the adhesion properties between the radiation-shielding material and the adhesive material used to bond electronic chip 110 to chip carrier portion 120; the adhesion properties between the radiation-shielding material and the metallic material in chip carrier portion 120; and the coefficients of thermal expansion (CTE) of the radiation-shielding material and the metallic material in chip carrier portion 120. The CTE of the metallic material in chip carrier portion 120 should match as closely as possible the CTE of the radiation-shielding material in chip carrier portion 120 in order to reduce shearing, bowing, and other stress-related effects.

Chip carrier portion 120 has a surface 123 and a surface 124 opposite surface 123. In the embodiment illustrated in FIG. 1, electronic chip 110 is mounted over surface 123 of chip carrier portion 120, and surface 124 of chip carrier portion 120 forms a portion of an exterior surface of electronic component 100. An embodiment where surface 124 forms a portion of an exterior surface of electronic component 100 may be referred to as an "exposed pad" embodiment. In a different embodiment, all of chip carrier portion 120 is entirely contained within an encapsulant or mold compound.

In one embodiment, layer 126 of chip carrier portion 120 is located adjacent only to surface 123 of chip carrier portion 120 and is absent at surface 124 of chip carrier portion 120. In another embodiment, layer 126 of chip carrier portion 120 is located adjacent only to surface 124 of chip carrier portion 120 and is absent at surface 123 of chip carrier portion 120. In the embodiment illustrated in FIG. 1, layer 126 of chip carrier portion 120 is located adjacent to both surface 123 and surface 124 of chip carrier portion 120. Layer 126 may extend along the entire height of sidewalls 121 and fold over the top of sidewalls 121. Folding layer 126 over the top of sidewalls 121 produces more complete coverage on sidewalls 121 than would possibly be the case if layer 126 were brought only to the top of sidewalls 121. More complete coverage may provide better radiation shielding properties. In one embodiment, electronic component 100 further comprises a layer 140 of the radiation-shielding material located over electronic chip 110. Layer 140 can be comprised of the same or a different radiation-shielding material as that found in layer 126.

Figure 2:
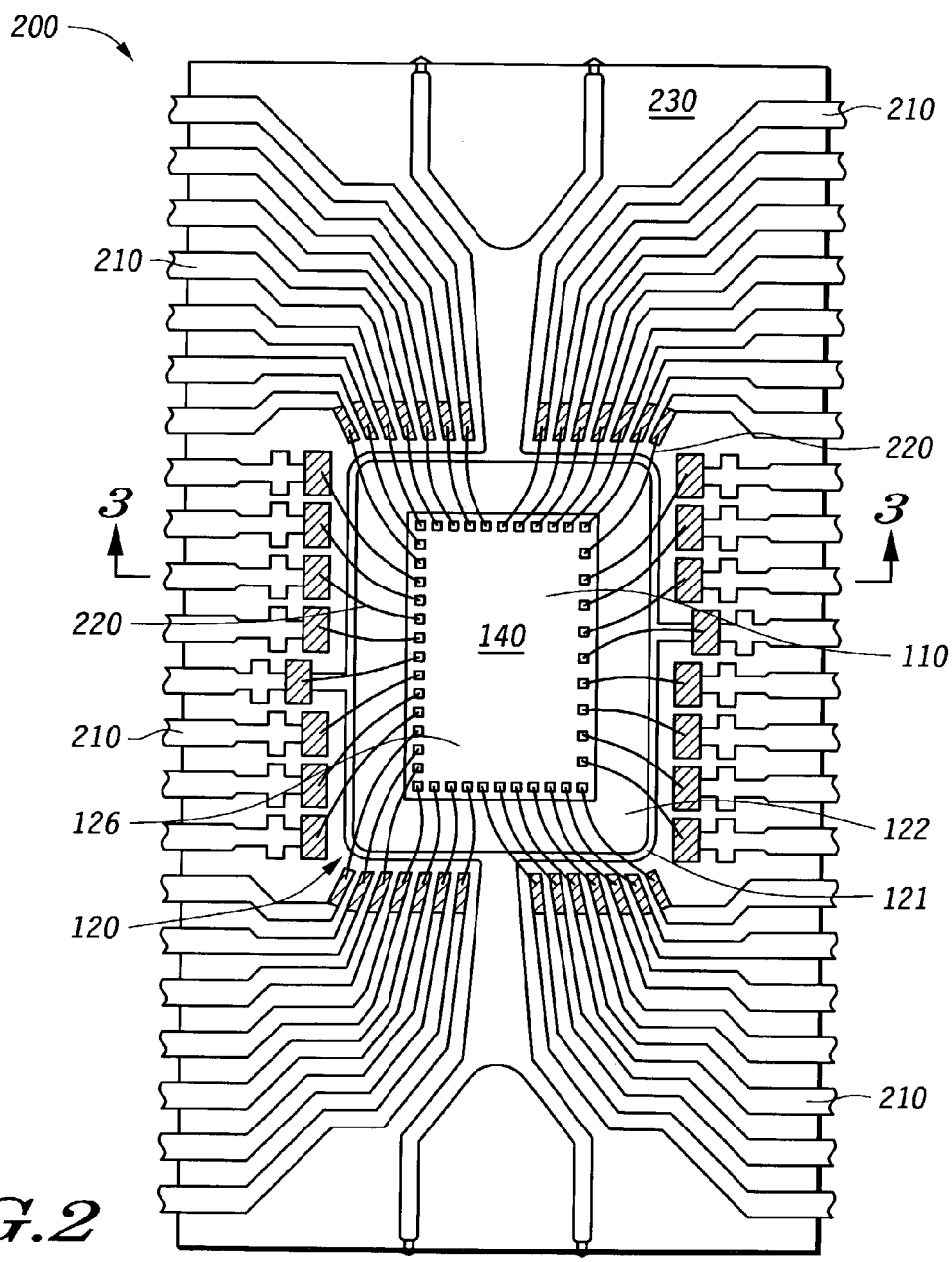
FIG. 2 is a top cross-sectional view of a portion of an electronic component according to another embodiment of the invention.
Figure 3:
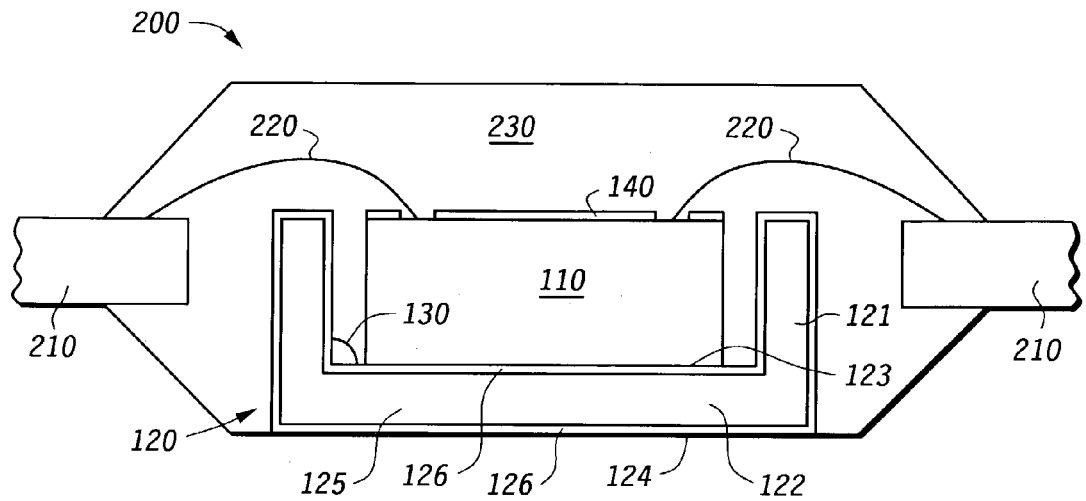
FIG. 3 is a side cross-sectional view of a portion of the electronic component of FIG. 2 taken along a section line 3—3 in FIG. 2 according to an embodiment of the invention.

Turning to the next two figures, FIG. 2 is a top cross-sectional view of a portion of an electronic component 200 according to another embodiment of the invention, and FIG. 3 is a side cross-sectional view of a portion of electronic component 200 taken along a section line 3—3 in FIG. 2 according to an embodiment of the invention. Electronic component 200 in FIGS. 2 and 3 comprises electronic chip 110, chip carrier portion 120, and layer 140. In the illustrated embodiment, electronic component 200 forms a leaded device. In another embodiment, electronic component 200 could form another kind of chip carrying structure. Electronic component 200 further comprises leads 210, wire bonds 220, and a mold compound 230. Electronic chip 110 is electrically coupled to leads 210 via wire bonds 220. In another embodiment, electronic chip 110 could be electrically coupled to leads 210 in some other fashion, as known in the art. Mold compound 230 surrounds or substantially surrounds electronic chip 110 and chip carrier portion 120. In one embodiment, chip carrier portion 120 is entirely encapsulated by mold compound 230.

Figure 4:
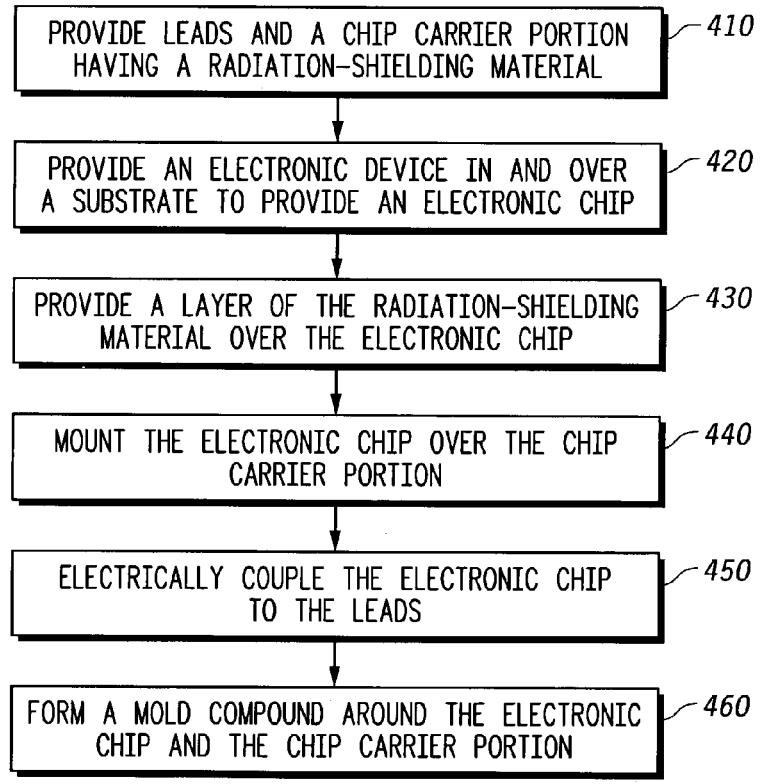
FIG. 4 is a flow diagram illustrating a method of manufacturing an electronic component according to an embodiment of the invention.

Referring now to FIG. 4, which is a flow diagram illustrating a method of manufacturing an electronic component according to an embodiment of the invention, a method 400 is described. A step 410 of method 400 is to provide leads and a chip carrier portion having a radiation-shielding material. As an example, the chip carrier portion can be similar to chip carrier portion 120 in FIGS. 1, 2, and 3. As another example, the leads can be similar to leads 210 in FIGS. 2 and 3. As a further example, the radiation-shielding material can be similar to the radiation-shielding material contained in layer 126 in FIGS. 1, 2, and 3.

A step 420 of method 400 is to provide an electronic device in and over a substrate to provide an electronic chip. As an example, the electronic chip can be similar to electronic chip 110 in FIGS. 1, 2, and 3. A step 430 of method 400 is to provide a layer of the radiation-shielding material over the electronic chip. As an example, this layer can be similar to layer 140 in FIGS. 1, 2, and 3. In one embodiment, this layer can be formed simultaneously with the formation of the electronic chip. In a different embodiment, this layer can be formed after the formation of the electronic chip.

A step 440 of method 400 is to mount the electronic chip over the chip carrier portion, and a step 450 of method 400 is to electrically couple the electronic chip to the leads. As an example, wire bonds, such as wire bonds 220 in FIGS. 2 and 3, can be formed during step 450. A step 460 of method 400 is to form a mold compound around the electronic chip and the chip carrier portion. As an example, the mold compound can be similar to mold compound 230 in FIGS. 2 and 3.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the electronic component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

All elements claimed in the claims are considered essential to the invention, and replacement of one or more claimed elements constitutes reconstruction and not repair of the claimed invention. Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An electronic component comprising:
an electronic chip; and
a leadframe comprising a chip carrier portion having sidewalls and a bottom portion;
wherein:
the electronic chip is mounted over the bottom portion of the chip carrier portion; and
the chip carrier portion shields the electronic chip from radiation outside of the electronic component.

2. The electronic component of claim 1 wherein:
the electronic chip is an MRAM device.

3. The electronic component of claim 1 wherein:
the chip carrier portion is comprised of copper and a radiation-shielding material.

4. The electronic component of claim 3 further comprising:
a radiation-shielding layer located over the electronic chip.

5. The electronic component of claim 3 wherein:
the copper is a first layer of the chip carrier portion; and
the radiation-shielding material is a second layer of the chip carrier portion.

6. The electronic component of claim 3 wherein:
the radiation-shielding material is comprised of a ferromagnetic material.

7. The electronic component of claim 6 wherein:
the ferromagnetic material comprises nickel-iron.

8. The electronic component of claim 6 wherein:
the ferromagnetic material comprises nickel-iron-cobalt.

9. The electronic component of claim 3 wherein:
the chip carrier portion has a first surface and a second surface opposite the first surface; and
the electronic chip is mounted over the first surface of the chip carrier portion.

10. The electronic component of claim 9 wherein:
the radiation-shielding material is located adjacent to the first surface and the second surface of the chip carrier portion.

11. The electronic component of claim 1 wherein:
the sidewalls have a height substantially equal to a height of the electronic chip.

12. The electronic component of claim 1 wherein:
the sidewalls comprise a unitary piece.

13. The electronic component of claim 1 wherein:
the sidewalls are contiguous with the bottom portion.

14. The electronic component of claim 1 wherein:
the sidewalls and the bottom portion form a unitary piece.

15. The electronic component of claim 1 wherein:
the sidewalls and the bottom portion are each substantially planar; and
the sidewalls are substantially perpendicular to the bottom portion.

16. The electronic component of claim 1 wherein:
the sidewalls and the bottom portion form an angle between approximately eighty degrees and one hundred degrees.

17. An electronic component comprising:
an electronic chip;
a ferromagnetic radiation-shielding layer over the electronic chip; and
a leadframe comprising a chip carrier portion having a bottom portion and sidewalls,
wherein:
the sidewalls and the bottom portion from a unitary piece;
the sidewalls and the bottom portion each comprise:
a first layer comprised of copper; and
a second layer comprised of a ferromagnetic radiation-shielding material; and
the electronic chip is mounted over the chip carrier portion.

18. The electronic component of claim 17 wherein:
the ferromagnetic radiation-shielding material and the ferromagnetic radiation-shielding layer comprise nickel-iron.

19. The electronic component of claim 17 wherein:
the chip carrier portion has a first surface and a second surface opposite the first surface;
the electronic chip is mounted over the first surface of the chip carrier portion; and
the second surface of the chip carrier portion forms a portion of on exterior surface of the electronic component.

20. The electronic component of claim 19 wherein:
the ferromagnetic radiation-shielding material is located adjacent to the first surface and the second surface of the chip carrier portion.

21. The electronic component of claim 17 wherein:
the sidewalls arid the bottom portion are each substantially planar;
the sidewalls are substantially perpendicular to the bottom portion; and
the sidewalls and the bottom portion comprise a unitary piece.

22. The electronic component of claim 17 wherein:
the sidewalls and the bottom portion form an angle between approximately eighty degrees and one hundred degrees.

* * * * *